(12) United States Patent
Takatsuka et al.

(10) Patent No.: US 6,876,189 B2
(45) Date of Patent: Apr. 5, 2005

(54) CURRENT SENSOR

(75) Inventors: Toshinori Takatsuka, Fuji (JP); Kenji Suzuki, Fuji (JP); Kenji Kuriyama, Fuji (JP)

(73) Assignee: Asahi Kasei Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/496,400

(22) PCT Filed: Nov. 26, 2002

(86) PCT No.: PCT/JP02/12305

§ 371 (c)(1),
(2), (4) Date: May 24, 2004

(87) PCT Pub. No.: WO03/046584

PCT Pub. Date: Jun. 5, 2003

(65) Prior Publication Data

US 2005/0030004 A1 Feb. 10, 2005

(30) Foreign Application Priority Data

Nov. 26, 2001 (JP) ........................ 2001-359976

(51) Int. Cl.⁷ .............................................. G01R 33/00
(52) U.S. Cl. .................... 324/117 H; 324/127
(58) Field of Search .................... 324/117 H, 117 R, 324/127, 126, 141, 142; 336/175, 178, 188

(56) References Cited

U.S. PATENT DOCUMENTS

| | | | |
|---|---|---|---|
| 2,814,015 A | * 11/1957 | Kuhrt | ........................ 323/368 |
| 4,749,939 A | 6/1988 | Seitz | |
| 4,864,223 A | * 9/1989 | Joder et al. | ............. 324/117 H |
| 5,694,103 A | * 12/1997 | Goodwin et al. | ........... 336/178 |

FOREIGN PATENT DOCUMENTS

| | | |
|---|---|---|
| EP | 0 867 725 A1 | 9/1988 |
| JP | 61-170073 | 10/1986 |
| JP | 01-240867 A | 9/1989 |
| JP | 01-152263 | 10/1989 |
| JP | 08-160079 A | 6/1996 |
| JP | 2001-221815 A | 8/2001 |
| TW | 91134337 | 11/2001 |

* cited by examiner

*Primary Examiner*—Ernest Karlsen
(74) *Attorney, Agent, or Firm*—Finnegan, Henderson, Farabow, Garrett & Dunner, LLP

(57) ABSTRACT

A current sensor according to the present invention is provided with a U-shaped conductor through which current under measurement flows, a magnetic sensor disposed between two straight portions parallel to each other both of which form the U-shaped conductor, a magnetic material of surrounding shape which surrounds the two straight portions and the magnetic sensor and includes a convex opposed to the magnetic sensor and a supporting member for supporting the conductor, the magnetic sensor and the magnetic material so as to position ends of the conductor and terminals of the magnetic sensor at the same side with respect to the magnetic material.

15 Claims, 16 Drawing Sheets

CURRENT SENSOR

TECHNICAL FIELD

The present invention relates to a current sensor, and more specifically to a current sensor comprising a conductor through which a current under measurement flows and a magnetic sensor for sensing a magnetic flux generated by the current under measurement. The magnetic sensor measures the values of the current under measurement are determined through detection of the magnetic flux generated by the current under measurement.

BACKGROUND ART

Currently, typically known magnetic sensors include a Hall sensor which harnesses the Hall effect, a magneto-resistance device, a magnetic transistor and other sensor. A current can be measured through detection of a magnetic flux generated by the current by means of any of the magnetic sensors as described. An example of conventional current sensors which have been widely used is illustrated in FIG. 1.

In FIG. 1, there are provided a magnetic core 100, a metal conductor 101 as a current path, a magnetic sensor 102, an amplifier 103, and an output terminal 104 of the amplifier 103.

However, the current sensor having this structure is difficult to be miniaturized since the magnetic core 100 for surrounding the metal conductor 101 through which current flows must be included. Moreover, the magnetic core 100 and the magnetic sensor 102 need to be separately manufactured before assembling those. This increases the manufacturing cost and makes it difficult to mass-produce the current sensor of this type.

Furthermore, the current sensor may be subject to magnetic noise coming through the gap of the magnetic core 100 in a lateral direction.

DISCLOSURE OF THE INVENTION

It is an object of the present invention to provide a current sensor having enhanced noise resistance. It is another object of the invention to provide a current sensor which is miniaturized by decreasing the number of the components included therein with enhanced productivity and assembling facility. It is still another object of the invention to provide a current sensor which is inexpensive, mass producible and attachable to surface mounting.

In order to achieve the above object, a current sensor according to the present invention senses a current under measurement based upon a magnetic flux generated by the current under measurement and comprises a U-shaped conductor through which the current under measurement flows; a magnetic sensor disposed between two straight portions parallel to each other both of which form the U-shaped conductor; a fence-shaped magnetic material for surrounding the two straight portions and the magnetic sensor and includes a first convex opposed to the magnetic sensor; and a supporting member for supporting the conductor, the magnetic sensor and the magnetic material so as to position ends of the conductor and terminals of the magnetic sensor at the same side of the supporting member with respect to the magnetic material. Since each end of the two straight portions of the conductor is disposed at the same side with respect to the magnetic material, surface mounting of the current sensor is facilitated. The magnetic material (or magnetic yoke) may be fence-shaped and closed in any surrounding shape and may have two openings.

Since terminals of the magnetic sensor penetrating through terminal hole of the supporting member and the two substantially straight portions of the conductor inserted through conductor inserting portions are supported at the same side of the supporting member, surface mounting of the current sensor to such as a printed-circuit board is facilitated, which considerably enhances productivity and assembling facility.

The supporting member preferably comprise the terminal hole through which the terminals of the magnetic sensor penetrate, the conductor inserting portions through which the conductor is inserted, first fixing members for fixing the magnetic sensor, second fixing members for fixing the conductor and third fixing members for fixing the magnetic material. The magnetic sensor can be inserted through the terminal hole from below upward and attachment of the magnetic sensor can be made even if the terminals of the magnetic sensor have a modified configuration. There is no need to alter a shape of the supporting member even if the terminals of the magnetic sensor have a modified configuration. The magnetic sensor can also be attached when cross-sectional area and configuration of the terminals of the magnetic sensor are varied or when the pitch of the terminals is changed.

It is preferable that each of the conductor inserting portions preferably is formed from a cylindrical member and the magnetic material is supported in such a manner as to surround the conductor inserting portions.

It is further preferable that the supporting member is integrally molded from an elastically deformable material and the first to third fixing members are hook-shaped.

The current sensor is preferably provided with a second convex at an inner surface of the magnetic material oppositely to the first convex, wherein the magnetic sensor is disposed within a gap between the first convex and the second convex.

In this case, the magnetic sensor preferably has a structure in which the magnetic sensor is disposed such that a face of the first convex opposed to the magnetic sensor is substantially parallel to a magnetometric sensing surface of the magnetic sensor, wherein an area of the magnetometric sensing surface is smaller than that of the opposed face.

The magnetic material preferably has a surface configuration which is symmetrical with respect to a reference plane which is substantially perpendicular to an opposed face of the first convex to the magnetic sensor and substantially parallel to the straight portions. Due to the configuration, a detected output is not easily affected by the positional accuracy of the magnetic sensor. Thus, high positional accuracy is not required and productivity and assembling facility of the current sensor are enhanced.

The magnetic material is preferably provided with a curved or tapered inner surface. This configuration prevents the magnetic material from easily reaching magnetic saturation, and thus allows the current sensor to exhibit improved linearity in its detection characteristics.

The curved or tapered surface is preferably formed around a periphery of the first convex and the magnetic material has no acute inner surface.

A ratio of a width to a height of the magnetic material is preferably equal to or greater than 2.5, wherein the width of the magnetic material is directed parallel to a plane defined by the two straight portions and perpendicular to the straight portions, and wherein the height of the magnetic material is directed perpendicular to the plane or the straight portions.

The supporting member is preferably provided with at least a convex at a side where the terminals of the magnetic sensor and the two straight portions are supported so as to reduce a contact area of the supporting member to a substrate on which the current sensor is mounted.

The supporting member is preferably provided with at least a convex or a concave around a periphery of a portion at an outer surface of the supporting member, at which portion the conductor penetrates through the supporting member, such that a pressure-resistant creepage distance is enlarged.

The terminals of the magnetic sensor are preferably folded into a predetermined shape or predetermined shapes.

The magnetic sensor preferably harnesses the Hall effect.

The current sensor having the above structure according to the present invention is small-sized, inexpensive, mass producible and not easily affected by magnetic noise with enhanced productivity and assembling facility. Thus, the current sensor of the invention is suitably applicable to a wide variety of situations.

Described hereinafter are several preferred embodiments according the present invention in conjunction with the following drawings.

BEST MODE FOR CARRYING OUT THE INVENTION (First Embodiment)

Figure 1:
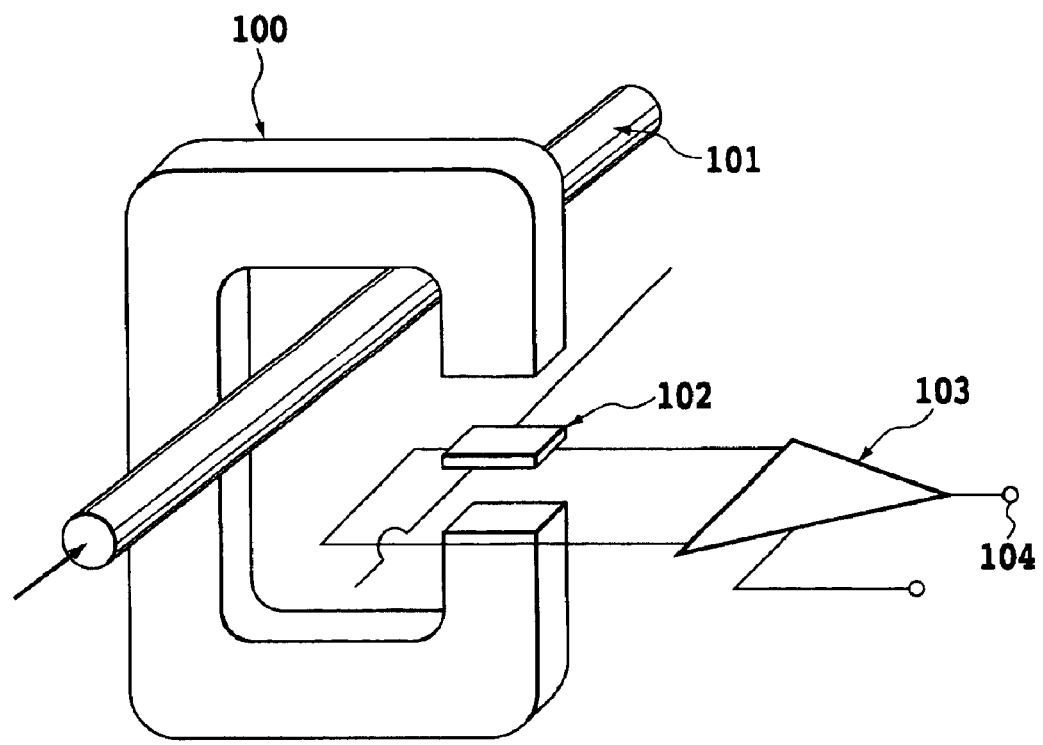
FIG. 1 is a perspective view illustrating an example of a conventional current sensor.
Figure 2:
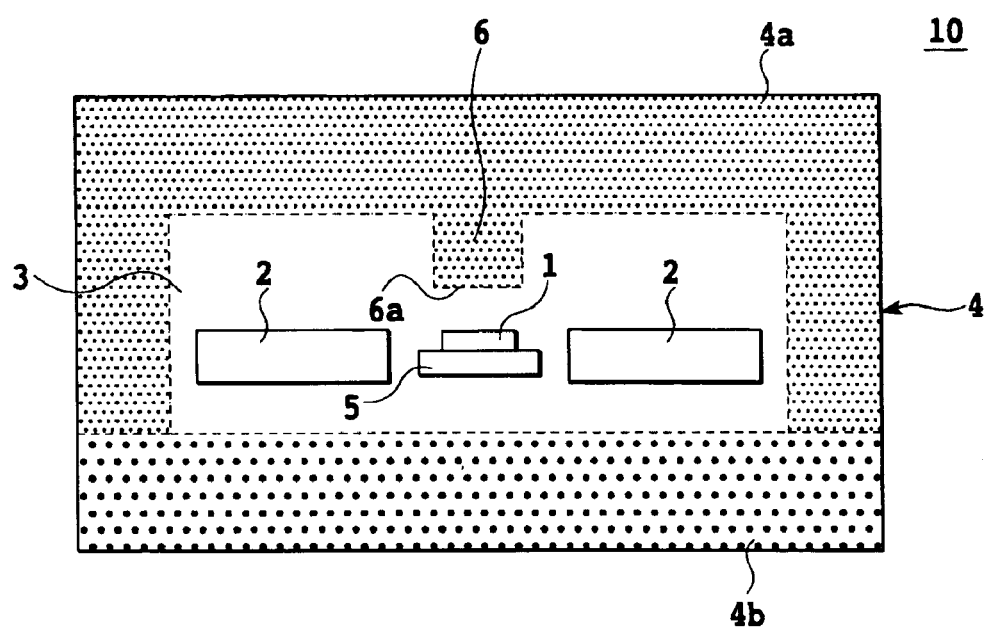
FIG. 2 is a cross-sectional view showing a current sensor of a first embodiment according to the present invention.
Figure 3:
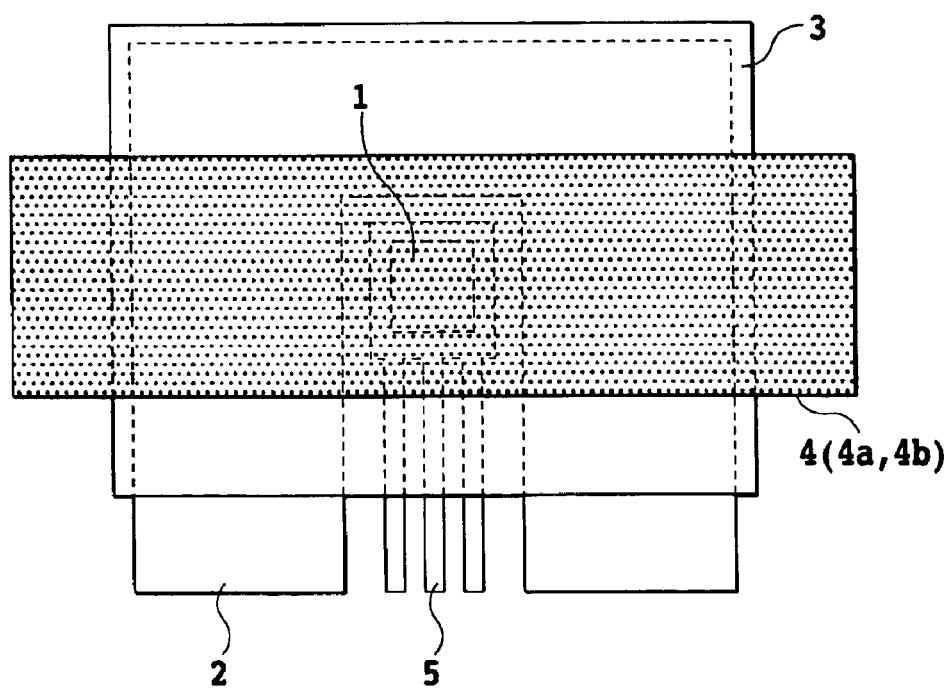
FIG. 3 is a plan view showing the current sensor of the first embodiment according to the invention.

FIG. 2 is a cross-sectional view illustrating a current sensor of a first embodiment according to the present invention. FIG. 3 is a plan view showing the current sensor of the first embodiment.

As illustrating in FIGS. 2 and 3, a current sensor 10 includes a magnetic sensor 1 as a means for detecting a magnetic flux. The magnetic sensor 1 detects a magnetic flux generated when a current under measurement (hereinafter abbreviated as "current") flows through a current path 2. In this embodiment, a Hall sensor which harnesses the Hall effect is employed as the magnetic sensor 1. The current path 2 is U-shaped and disposed in such a manner as to surround the magnetic sensor 1. Thus, the magnetic flux tends to gather in the vicinity of the magnetic sensor 1. The magnetic sensor 1 and the current path 2 are enclosed within an insulating enclosure 3 (made from molded resin in this embodiment) to be formed into one piece.

There is also provided a magnetic yoke 4 around the insulating enclosure 3, which yoke is formed by combining an E-shaped ferrite core 4a and an I-shaped ferrite core 4b at the junctions without spacing. The magnetic yoke 4 is used to converge the magnetic flux generated by the current flowing through the current path 2 on a magnetometric sensing surface (not shown) of the magnetic sensor 1. The magnetic yoke 4 has a convex 6 which is positioned approximately at the center of the lower surface of the ferrite core 4a oppositely to the magnetic sensor 1. The magnetic yoke 4 has almost uniform magnetic characteristics throughout. The fence-shaped magnetic yoke 4 surrounding a part of the current path 2 and the magnetic sensor 1.

Additionally, the magnetic sensor 1 is mounted on a lead frame 5 of a non-magnetic material as illustrated in FIGS. 2 and 3.

Hereinafter described is a magnetic field simulation for the current sensor 10 of the first embodiment having the above structure. The simulation was performed by a finite element analysis method.

In the magnetic field simulation, a Hall device HG-106C (product name) manufactured by Asahi Kasei Electronics Co., Ltd. was employed as the magnetic sensor 1. A copper wire having a cross-sectional area of 2 mm (vertical)×0.5 mm (lateral) was used as the current path 2, and a ferrite having a specific magnetic permeability of 6,000 as the magnetic yoke 4. A gap between the E-shaped ferrite core 4a and the I-shaped ferrite core 4b was 1.3 mm in length. The magnetic sensor 1 was disposed within the gap.

Figure 4:
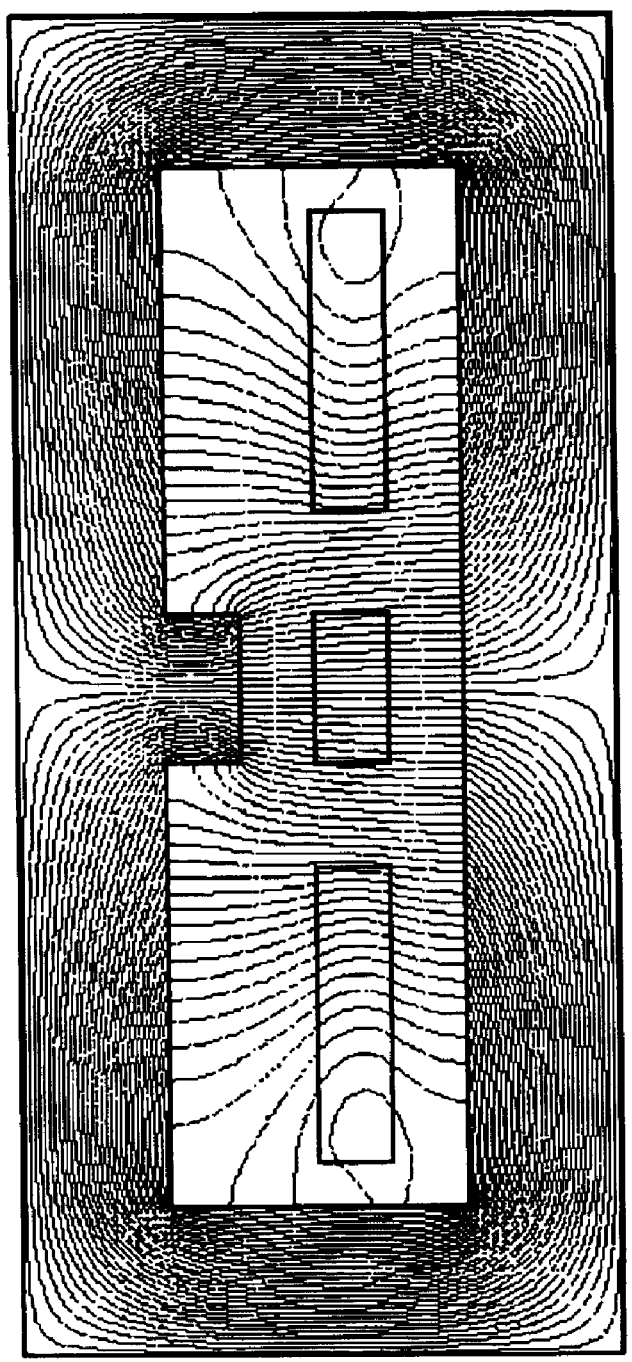
FIG. 4 illustrates lines of magnetic force as a result of a magnetic simulation executed using the current sensor of the first embodiment according to the invention.

FIG. 4 shows lines of magnetic force at the gap within which the magnetic sensor 1 is positioned as a result of the simulation. The lines of magnetic force were generated when direct current of 1A flows through the current path 2 under the above conditions.

As can be seen from the simulation result shown in FIG. 4, the density of the magnetic flux generated by the current under measurement is high at the gap within which the magnetic sensor 1 is disposed (shown in FIG. 2). According to a calculation by the applicant of the present invention, it was found that the magnetic flux density is 0.97 mT at the region where the magnetic sensor 1 is located when current of 1A flows through the current path 2 (shown in FIG. 2).

It was also found that, when the current flowing through the current path 2 is increased, the magnetic flux density at the gap where the magnetic sensor 1 is positioned is increased in proportion to the current increase. That is, the output voltage of the magnetic sensor 1 is proportional to the current. Thus, the current sensor 10 having the above structure sufficiently performs its current measurement functions by obtaining the output voltage through detection of the magnetic flux by means of the magnetic sensor 1 and subsequently by converting the output voltage to a corresponding value of current as the current under measurement by means of an external integrated circuit or other means while referring to the output voltage obtained when current of 1A flows through the current path 2.

(Second Embodiment)

In the structure of the first embodiment which includes the E-shaped core and the I-shaped core, the positional accuracy of the magnetic sensor 1 is required. More specifically, if the magnetic sensor 1 is displaced in the lateral direction in FIG. 2, the magnetic flux density obtained from the measurement varies.

A second embodiment was carried out as an improvement over the first embodiment for solving the above problem. In the second embodiment, two E-shaped cores as the magnetic yoke 4 are combined at the junctions without spacing.

In the magnetic field simulation of the second embodiment, a Hall device HG-106C (product name) manufactured by Asahi Kasei Electronics Co., Ltd. was employed as the magnetic sensor 1. A copper wire having a diameter of 1.0 mm was used as the current path 2, and a ferrite having a specific magnetic permeability of 6,000 as the magnetic yoke 4. A gap between the upper E-shaped ferrite core and the lower E-shaped ferrite core was 1.2 mm in length. The magnetic sensor 1 was disposed within the gap.

Figure 5:
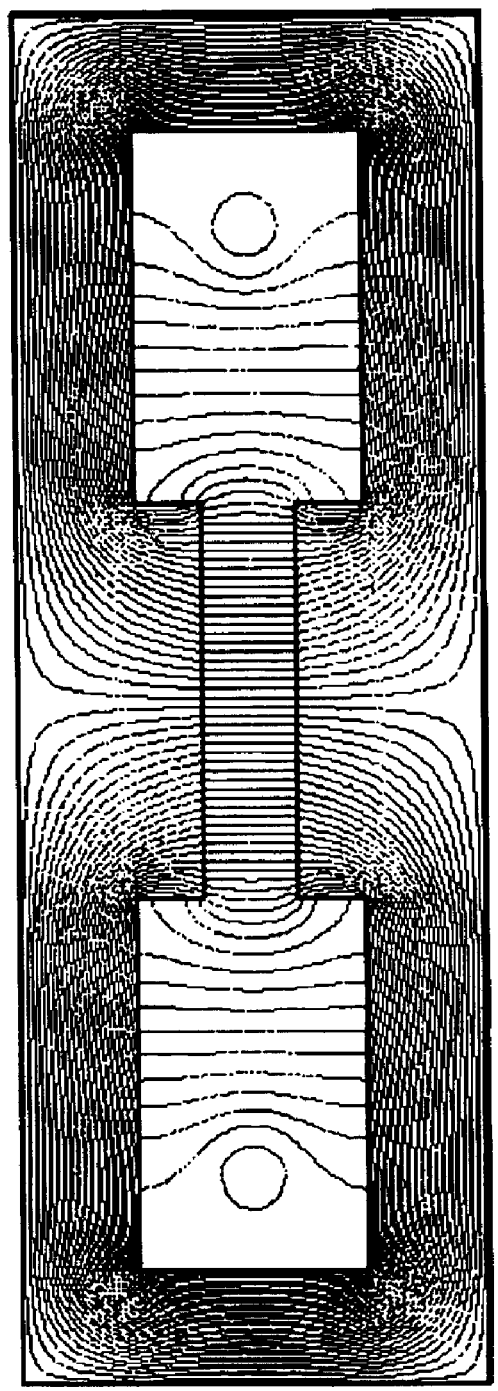
FIG. 5 illustrates lines of magnetic force as a result of a magnetic simulation executed using a current sensor of a second embodiment according to the invention.

FIG. 5 illustrates lines of magnetic force as a result of the simulation, which were obtained from a calculation of the magnetic flux density at the gap within which the magnetic sensor 1 was disposed in the vertical direction in FIG. 2 when direct current of 1A flows through the current path 2 under the above conditions.

As obvious from comparison between the results in FIGS. 4 and 5, the magnetic flux is more uniformly distributed at the core gap in the second embodiment than in the first embodiment. Accordingly, high positional accuracy of the magnetic sensor 1 in the lateral direction is not required in the second embodiment and thus the assembly facility is enhanced.

As described, a current sensor according to this embodiment includes the magnetic yoke 4 which is a combination of the two E-shaped cores as illustrated in FIG. 5. The upper E-shaped ferrite core of the magnetic yoke 4 has the convex 6. The magnetic yoke 4 has a symmetric shape with respect to a reference plane (not shown) which is substantially parallel to an opposite face 6a (shown in FIG. 2) of the convex 6 opposed to the magnetic sensor 1. Also, the magnetic yoke 4 is shaped symmetrically with respect to another reference plane (not shown) which is substantially perpendicular to the opposite face 6a of the convex 6 opposed to the magnetic sensor 1 and is substantially parallel to substantially straight portions of the current path 2.

The scope of the present invention is not limited to the above embodiments, but other changes and modifications may be made.

In both of the first and second embodiments, a conductor as the current path 2 has a curved portion (specifically, a portion having two right-angled corners) formed in succession from two substantially straight portions such that the substantially straight portions are substantially parallel to each other. The curved portion of the conductor 2 is positioned at one open side of the magnetic yoke 4 (i.e., the upper side of the magnetic yoke 4 as viewed in FIG. 3), and the ends of the substantially straight portions are positioned at the other open side of the magnetic yoke 4 (i.e., the lower side of the magnetic yoke 4 as shown in FIG. 3). This construction is only an example which is selected in view of a manufacturability in surface mounting of the current sensor.

Additionally, in the above embodiment in which the manufacturability in the surface mounting is considered, the curved portion is not limited to the portion having two right-angled corners, but may be only a curved region which connects the two straight portions.

(Third Embodiment)

Figure 6A:
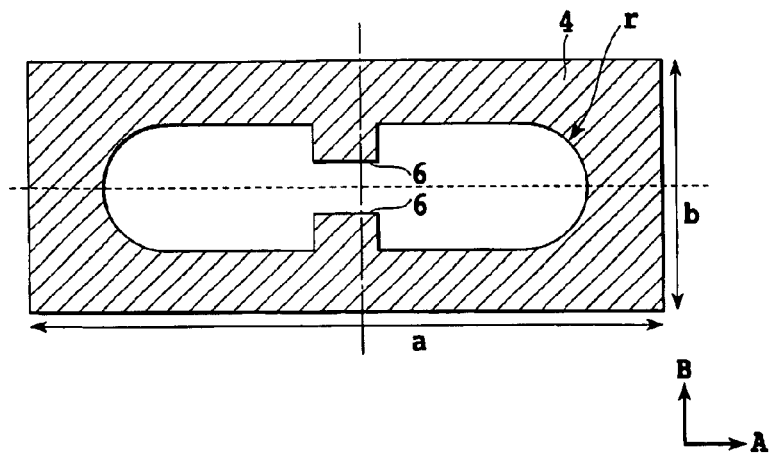
FIGS. 6A through 6C are cross-sectional views schematically illustrating main structures of a current sensor of a third embodiment and other modifications thereof according to the invention.
Figure 6B:
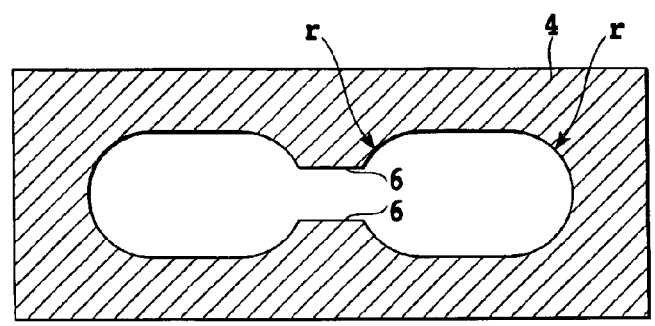
Figure 6C:
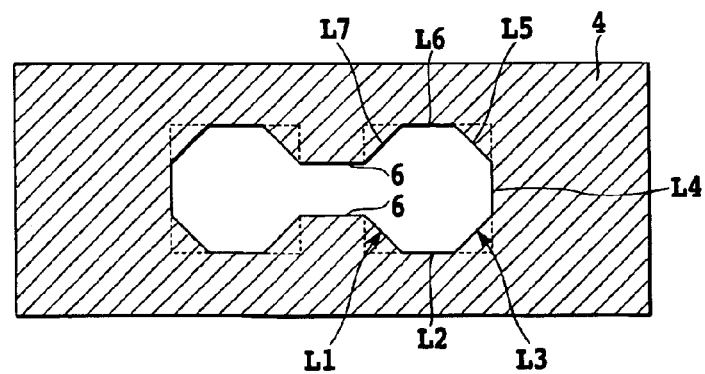

FIGS. 6A through 6C schematically illustrate the principal part of a third embodiment and its modifications according to the present invention. FIG. 6A shows a cross-section of a U-shaped internal configuration example of the magnetic yoke 4.

The inner shape of the magnetic yoke 4 is symmetrical with respect to a first reference plane shown by a broken line in FIG. 6A with the convexes 6 provided at the centers of the inner surface of the magnetic material (or magnetic yoke 4) which convexes are vertically opposed to each other The U-shaped curved surfaces at both ends of the inner configuration of the magnetic yoke 4 are also symmetrical with respect to a second reference plane shown by an alternate long and short dash line as illustrated in FIG. 6A. Thus, the surface configuration of the magnetic yoke 4 is symmetrical with respect to the two reference planes in the vertical and lateral directions.

The magnetic yoke 4 as the magnetic material having the above inner shape does not easily reach magnetic saturation. Moreover, as the surface configuration of the magnetic yoke 4 is symmetrical with respect to both of the two reference planes crossing approximately at right angle, the detection accuracy of the magnetic sensor 1 is not easily affected by changes in position of the magnetic sensor 1. Thus, high positional accuracy of the magnetic sensor 1 is not required.

In this embodiment, the length of the inner space of the magnetic material (or magnetic yoke 4) in an arrow B direction shown in FIG. 6A is the largest approximately at the middle portions between the convexes 6 and the right and left ends of the inner space in an arrow A direction shown in FIG. 6A, and is minimum at the right and left ends of the inner space in the direction A. This configuration also provides the above-described advantage.

The longitudinal-lateral length ratio a/b of the magnetic yoke 4 is preferably equal to or grater than 2.5.

When the ratio a/b is in this range, the current sensor including a magnetic material having identical magnetic characteristics can be easily made thin and compact.

For further preventing the magnetic yoke 4 from reaching magnetic saturation, the length of the inner space of the magnetic yoke 4 in the direction B at both sides of the convexes 6 may be smaller than the length approximately at the middle portions between the convexes 6 and the right and left ends of the inner space in the direction A.

This configuration can be realized as following two modifications. FIG. 6B shows a modification the inner surface of which has curved portions having a radius r at both sides of the convexes 6.

FIG. 6C illustrates a modified example of the magnetic yoke 4 the inner surface of which has no curved portion but consists of short straight lines L1 through L7 which are successively connected in numerical order to form tapered portions. In this modification, the sides L1 and L7 of the convexes 6 are formed at an angle of approximately 45 degrees to the lower and upper faces in the lateral direction in the figure, respectively, and substantially parallel to the opposed faces (L5 and L3) opposed to L1 and L7, respectively.

(Fourth Embodiment)

Figure 7:
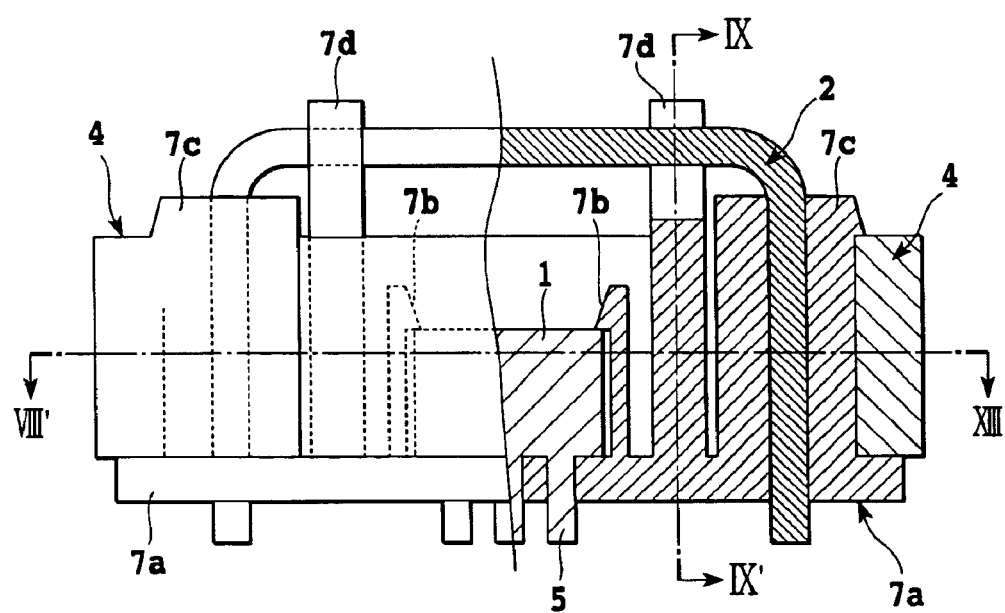
FIG. 7 is a partial plan cross-sectional view showing a current sensor of a fourth embodiment according to the present invention.
Figure 8:
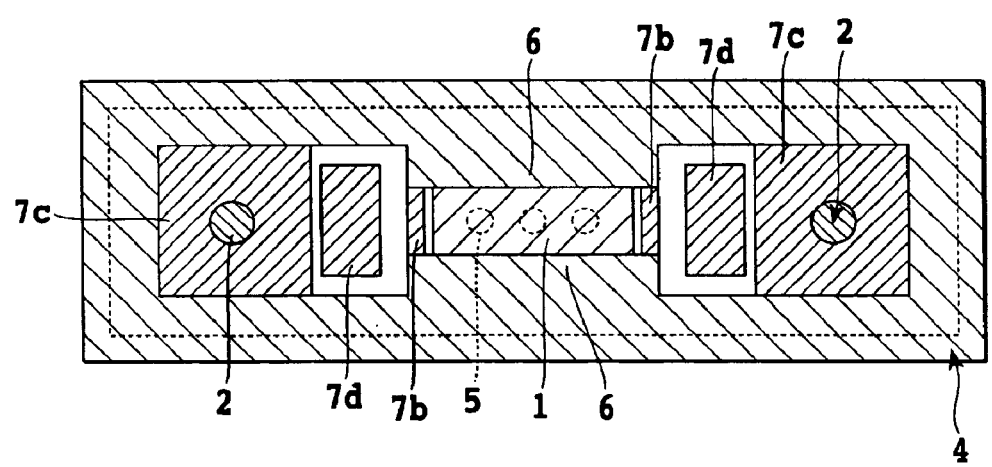
FIG. 8 is a cross-sectional view of the current sensor of the fourth embodiment according to the invention taken along the line VIII–VIII' in FIG. 7.
Figure 9:
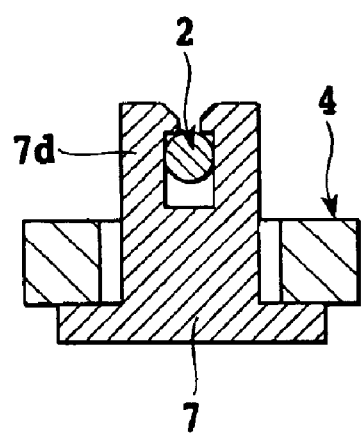
FIG. 9 is a cross-sectional view of the current sensor of the fourth embodiment according to the invention taken along the line IX–IX' in FIG. 7.

FIGS. 7, 8 and 9 show a partial cross-sectional view of a current sensor of a fourth embodiment according to the present invention, a cross-sectional view of the current sensor according to this embodiment taken along a line VIII–VIII' in FIG. 7, and a cross-sectional view of the current sensor according to this embodiment taken along a line IX–IX' in FIG. 7, respectively.

The current sensor according to this embodiment does not require a bonding process but has only a structure producible through fitting and inserting processes for enhancing assembling facility and productivity. Components of the current sensor other than the conductor, the magnetic material (magnetic yoke) and the magnetic sensor such as a Hall sensor are hereinafter referred to as "the members", which are made from elastically deformable plastics or other material.

As illustrated in FIG. 7, the members are composed of a plate-like base 7a at which respective members are formed, a pair of magnetic sensor holders 7b, a pair of conductor inserting portions 7c through which the conductor 2 as the current path penetrates, and a pair of conductor holders 7d for supporting the conductor 2. The members are integrally formed from suitable material such as ABS resin or PBT resin.

There are also provided terminal holes through which terminals 5 of the magnetic sensor 1 penetrate approximately at the center of the base 7a. Since a Hall IC is employed as the magnetic sensor 1 in this embodiment, three terminal holes are provided. The two sensor holders 7b for supporting the magnetic sensor 1 are disposed on the base 7a oppositely to each other with the terminal holes interposed between the sensor holders 7b. Each of the sensor holders 7b is provided with a hooked click at its end. This click is used to fix and retain the top of the inserted magnetic sensor 1.

As illustrated in FIG. 7, there is further provided a conductor hole through which the conductor 2 as the current path for the current under measurement penetrates at both side of the base 7a. Each of the conductor inserting portions 7c provided with the conductor hole is formed in a convex as shown in the figure. The respective straight portions of the conductor 2 through which the current under measurement flows (the vertical portions of the conductor 2 in FIG. 7) are each inserted into the corresponding conductor holes.

Each end of the conductor inserting portions 7c at the both sides of the base 7a has a hooked click at a side facing toward the magnetic yoke 4 or magnetic material (the upper outside portions of the conductor inserting portions 7c in FIG. 7). The conductor inserting portions 7c are fastened to the magnetic yoke 4 because these clicks fix the magnetic yoke 4. The conductor 2 is also fitted in to the conductor holders 7d, thereby being supported by both the conductor inserting portions 7c and the conductor holders 7d.

The ends of the two separate conductor holders 7d formed on the base 7a overhang the conductor inserting portions 7c. Each end of the conductor holders 7d has a hooked click (shown in FIGS. 7 and 9). The conductor 2 is fixed by these clicks and supported by the conductor holders 7d.

The magnetic yoke 4 is inserted from above onto the base 7a and held between the clicks of the conductor inserting portions 7c and the base 7a. An opposed pair of the convexes 6 are formed on the inner surface of the magnetic yoke 4 (shown in FIG. 8) and the magnetic sensor 1 is interposed between the convexes 6. It is preferable that a gap between the magnetic sensor 1 and the magnetic yoke 4 is smaller.

According to this embodiment in which the members are formed from resin and constructed as above, the terminals 5 of the magnetic sensor 1 penetrating through the terminal holes of the members and the terminals of the two substantially straight portions of the conductor 2 penetrating through the conductor holes are supported at the same side with respect to the members (under the base 7a in FIG. 7). Thus, the current sensor can be easily assembled and manufactured by first fitting the magnetic sensor 1 from above to the base 7a, then inserting the conductor 2 and finally attaching the magnetic yoke 4. Accordingly, the assembling facility of the current sensor is enhanced, and thus the current sensor can be surface mounted with facile to a printed-circuit board or the like.

(Fifth Embodiment)

Figure 10:
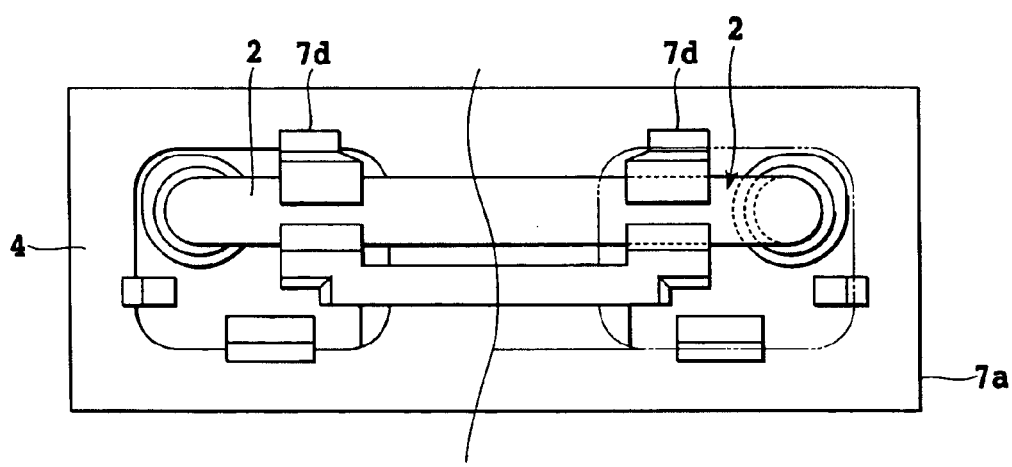
FIG. 10 is a plan view showing a current sensor of a fifth embodiment according to the invention from which a magnetic yoke is partially removed.
Figure 11:
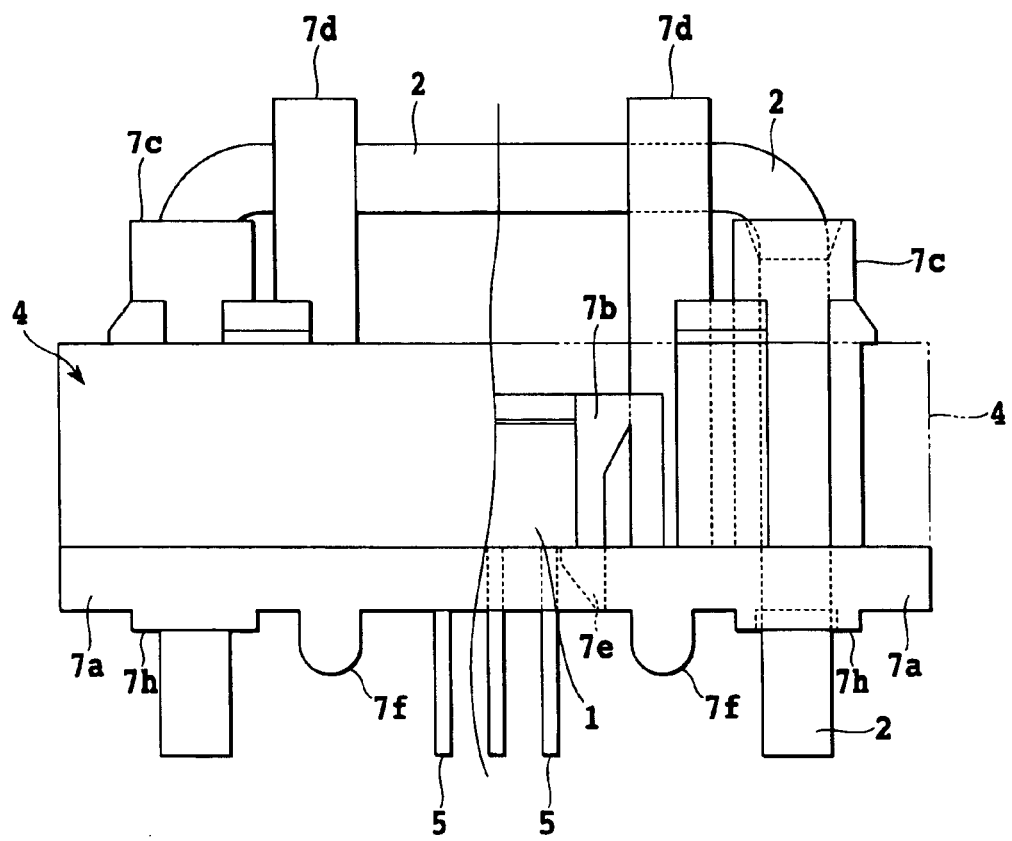
FIG. 11 is a front view showing the current sensor of the fifth embodiment according to the invention from which the magnetic yoke is partially removed.

FIGS. 10 and 11 are plan view and front view illustrating a current sensor of a fifth embodiment according to the present invention. In both of the figures, the left half shows the entire external appearance of the current sensor, and the right half shows the structure of the current sensor from which the magnetic yoke 4 (shown by alternate long and two short dashes lines) is removed. In the right halves in FIGS. 10 and 11, supporting member formed integrally from resin or other material, the conductor 2 as the current path for primary current, and the magnetic sensor 1 (Hall sensor) are disposed. The "supporting member" in this embodiment and other modifications correspond to the "the members" in the above-described embodiment.

As illustrated in FIGS. 10 and 11, a terminal hole is provided at the center of the base 7a of the supporting member. The magnetic sensor 1 is inserted from the lower surface of the base 7a into the terminal hole. The magnetic sensor holders 7b of the supporting member have hooked clicks 7e directed downward for supporting the inserted magnetic sensor 1. The clicks 7e support the magnetic sensor 1 by fixing the edge of the magnetic sensor 1 near the terminals 5. As described, in the structure of this embodiment the magnetic sensor 1 can be inserted from the lower surface of the base 7a of the supporting member into the terminal hole. Even after the terminals 5 of the magnetic sensor 1 is folded (formed), it is possible to insert the magnetic sensor 1 into the terminal hole of the supporting member for assembly. This improves productivity and assembling facility.

Figure 12A:
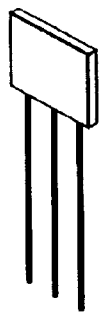
FIGS. 12A through 12G are perspective views each illustrating an example of modified terminals of a Hall sensor (magnetic sensor)
Figure 12B:
Figure 12C:
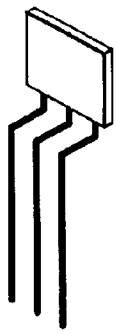
Figure 12D:
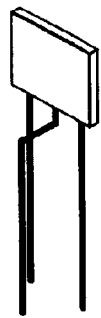
Figure 12E:
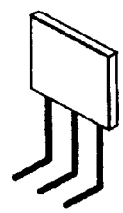
Figure 12F:
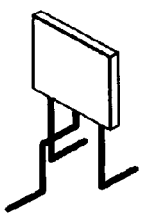
Figure 12G:
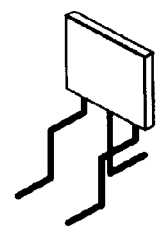

FIGS. 12A through 12G illustrate various modifications of the terminal shapes of the magnetic sensor 1. FIG. 12A shows straight type terminals, while FIGS. 12B through 12G show modified folded (formed) type terminals. The folding direction of the terminals may be in an opposite direction to the direction shown in the figures.

In the current sensor having the supporting member of this embodiment, after the terminals 5 is folded into any shape selected from the examples shown in FIGS. 12A through 12G, the magnetic sensor 1 can be attached to the supporting member. That is, even when the forming shape of the terminals 5 of the magnetic sensor 1 is modified, the magnetic sensor 1 can be fitted without the necessity of altering the shape of the supporting member. Further, the magnetic sensor 1 can be attached to the supporting member even when the sectional area or the sectional shape of the terminal 5 of the magnetic sensor 1 is varied. Additionally, the magnetic sensor 1 can be attached to the supporting member even when the interval of the terminals 5 of the magnetic sensor 1 is different.

Figure 13A:
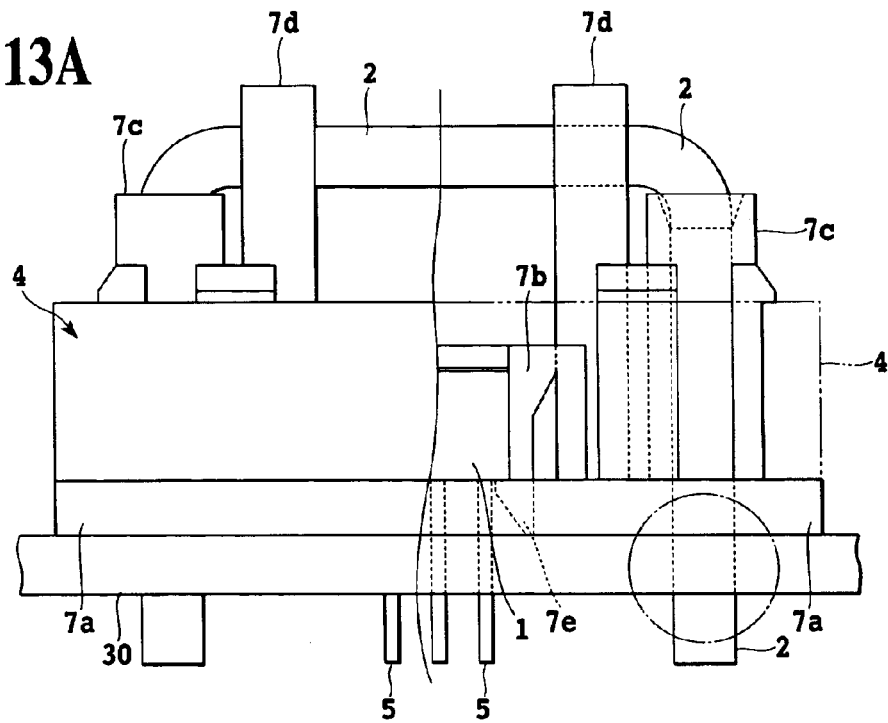
FIGS. 13A and 13B are front views each illustrating a current sensor without and with convexes beneath a table, respectively, for comparison of the effect of the convexes in the current sensor.

The lower surface of the base 7a of the supporting member included in the current sensor in FIGS. 10 and 11 has convexes 7f for decreasing the contact area of the supporting member to a substrate on which the current sensor is mounted. In a current sensor shown in FIG. 13A which has a flat lower surface with no convexes, solder cracking may be caused in an area where the conductor 2 is soldered (circled by an alternate long and short dash line at a printed-wiring board 30) due to difference in thermal expansion coefficient between the supporting member and the printed wiring board 30.

Figure 13B:
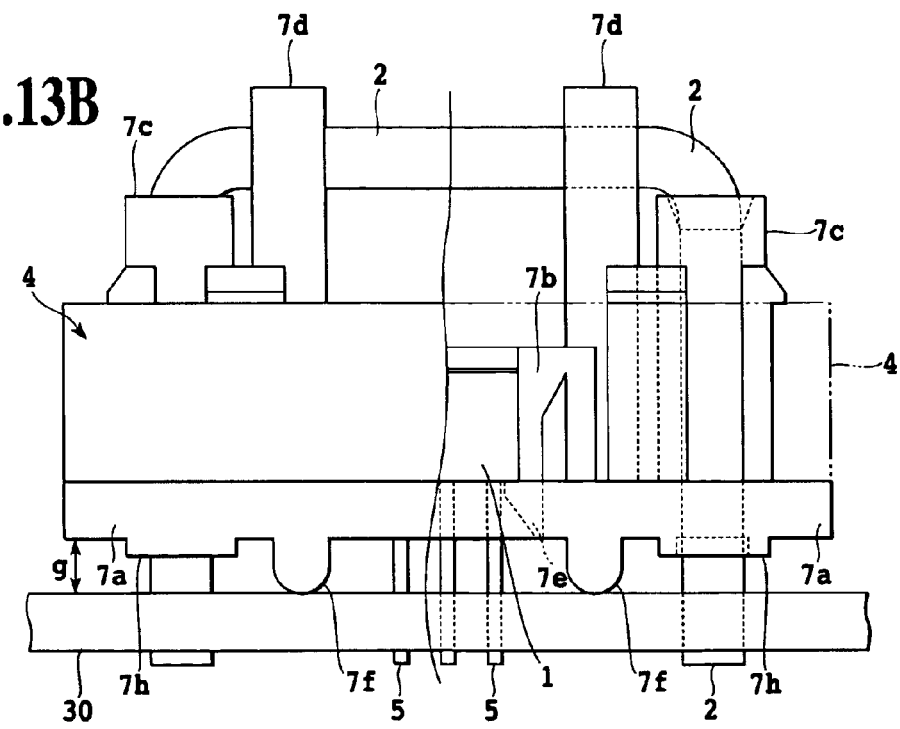

However, as illustrated in FIG. 13B, when the current sensor having the convexes 7f is soldered there exists a spacing g between the surface of the printed-wiring board 30 and the lower surface of the base 7a. The spacing g reduces a considerable amount of thermal stress acting between the printed-wiring board 30 and the supporting member, thereby solder cracking is prevented. The spacing g is preferably at least approximately 1 mm in order to sufficiently prevent solder cracking.

A creepage distance between the conductor 2 as the primary current path and the electric conductor (magnetic yoke 4 or terminals 1b) is set equal to or higher than a predetermined value according to voltage specification. In the current sensor, it is required to establish respective creepage distances between the primary current conductor wire and the magnetic sensor terminals and between the primary current conductor wire and the magnetic yoke at a value which meets the voltage specification. This requirement inhibits miniaturizing the current sensor.

In order to make the current sensor compact, there are further provided convexes 7h around the portions of the base 7a of the supporting member as illustrated in FIG. 11. The conductor 2 penetrates through the portions. Each of the convexes 7h has a cylindrical shape with a hollow inside. The configuration of the convexes 7h enlarges the pressure creepage distance.

Figure 14:
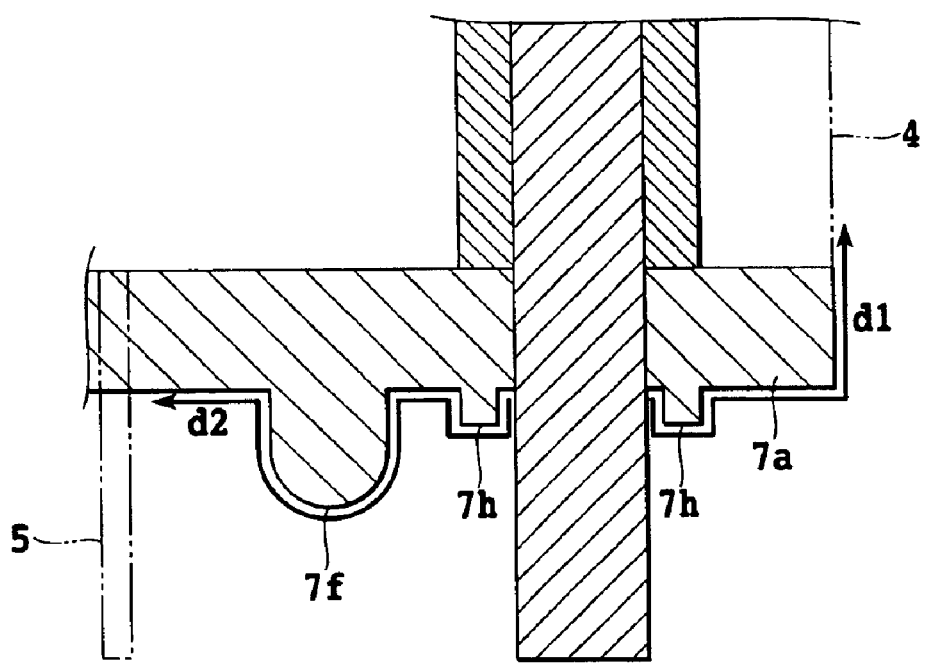
FIG. 14 is a partially enlarged cross-sectional view showing the current sensor in FIG. 13B in which creepage distances are elongated.

FIG. 14 is a partially enlarged cross-sectional view of the above current sensor for more detailed explanation of the operation of the convexes 7h. In the current sensor having this structure, the convexes 7h provided on the lower surface of the base 7a enlarge a creepage distance d1 between the primary current conductor wire and the magnetic yoke and a creepage distance d2 between the primary current conductor wire and the magnetic sensor terminals. The current sensor including the convexes 7h is approximately 4 mm shorter than a current sensor having no convexes 7h in the lateral direction in the figure.

FIGS. 11 and 14 illustrate the current sensor which satisfies the requirement of the creepage distance by including the convexes 7h on the lower surface of the base 7a. The same effect can be obtained by providing concaves on the lower surface thereof to fulfill the requirement of the creepage distance. It is more advantageous for miniaturization of the current sensor to include both convexes and concaves.

Additionally, resin may be potted into the gap within the magnetic material (magnetic yoke 4), that is, into the region where the magnetic sensor 1 is supported by the supporting member. The potted resin fixes the magnetic yoke 4, the supporting member and the magnetic sensor 1. Even if there is a spacing between the clicks of the supporting member for holding the magnetic yoke 4 and the magnetic yoke 4, because of the fixation by the resin potted, there occurs no vibration noise caused by collisions between the magnetic yoke 4 and the supporting member when the current sensor vibrates.

Figure 15A:
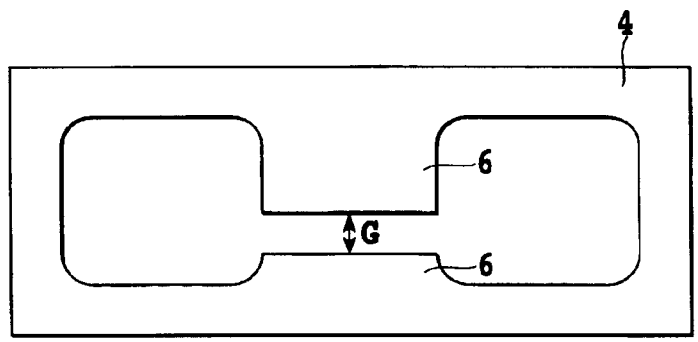
FIGS. 15A and 15B are plan views each illustrating a modified example of a magnetic material.
Figure 15B:
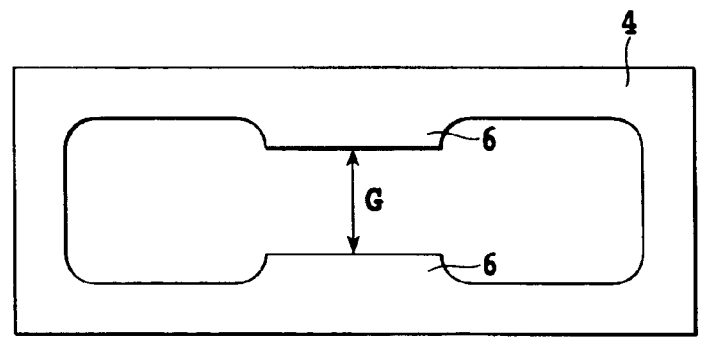

FIGS. 15A and 15B illustrate modified examples of the magnetic yoke 4. A gap length G of the gap is different in these Figures. The gap length G is 1.3 mm in FIGS. 15A and 3.2 mm in FIG. 15B.

Figure 16A:
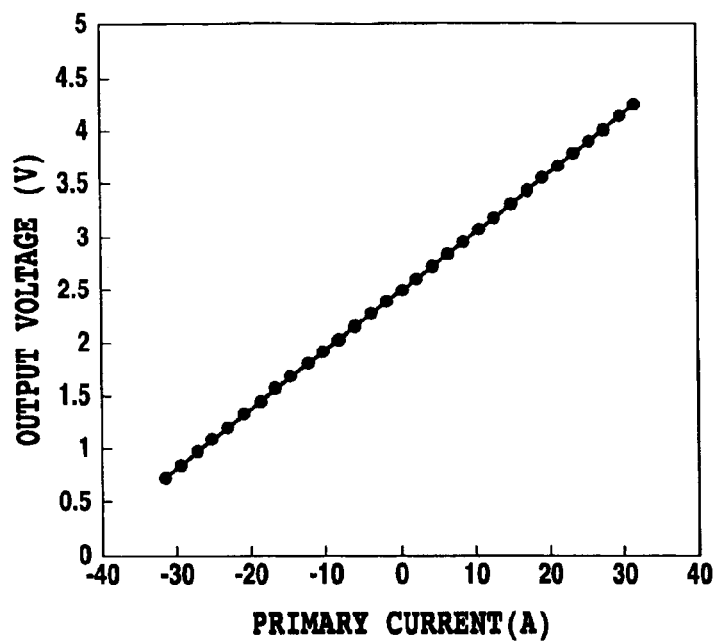
FIGS. 16A and 16B are characteristic graphs showing relationships between primary current and output voltage of current sensors including the magnetic materials in FIGS. 15A and 15B, respectively.
Figure 16B:
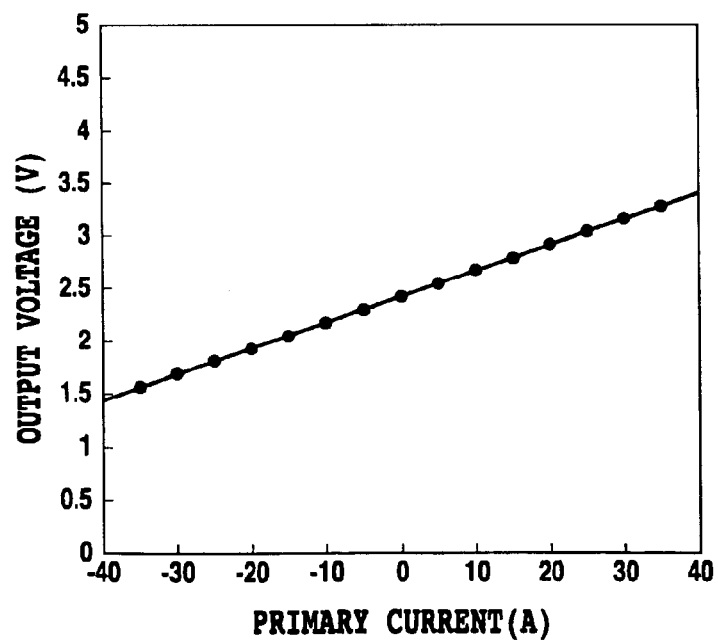

FIGS. 16A and 16B show the detected characteristics of the current sensors including the respective types of the magnetic yoke 4 in FIGS. 15A and 15B, respectively. In both figures, the lateral axis indicates values of primary current flowing through the conductor 2, while the vertical axis indicates values of output voltage from the magnetic sensor 1. Comparison between the characteristics of the respective current sensors in the figures shows that the current sensor having the shorter gap length G provides higher detection sensitivity. Comparing measuring ranges of the current under measurement, the current sensor having the gap length G of 1.3 mm represents linear characteristics from −30 A to +30 A and is usable within this range (FIG. 16A). Meanwhile, the current sensor having the gap length G of 3.2 mm is usable up to or higher than 40 A (FIG. 16B). Thus, it is obvious that the current sensor having a longer gap length G offers a broader measurable range of the current under measurement.

Accordingly, the detection sensitivity and the measurable range can be changed by altering the gap length G.

(Alternate Modified Examples)

Various modified examples have been described, but other modifications and changes may be made without departing from the technical scope of the present invention. For example, various magnetic sensors such as a device making use of magneto-resistance effects other than the above-described Hall sensor may be employed as the magnetic sensor. The magnetic sensor of analog-output type is preferable. A conversion means for converting an output detected by the magnetic sensor to a corresponding value of the current under measurement may further be included.

Further, a linear Hall IC containing an amplifier may be used as the magnetic sensor to increase detection sensitivity and enhance measurement accuracy of the current under measurement.

Preferably, the conductor is formed from a material such as copper which has low resistance and causes no voltage drop due to the current under measurement, and which material does not create residual magnetism when no current flows therein.

The magnetic material (magnetic yoke) may be made from various types of magnetic materials such as ferrite and permalloy, but it is more preferable to use a material which can be formed into a compact shape and is inexpensive such as ferrite.

When the supporting member are formed from an elastically deformable material such as ABS resin or PBT resin and include a plurality of clicks for fixing the magnetic sensor, the conductor and the magnetic material fitted to the supporting member, assembling these components is facilitated without requiring bonding process and the productivity is thus enhanced. Especially, it is more preferable to employ PBT (polybutylene terephthalate) having CTI (comparative tracking index) value of 250 or higher and incombustibility of UL94-V0 as the resin for the supporting member.

The fence-shaped magnetic yoke is preferably formed integrally, but may be made into one piece of fence-shaped by combining a plurality of pieces formed from magnetic material as in the first and second embodiments in view of assembling facility and other reasons.

As aforementioned, the current sensor according to the present invention comprises the conductor through which current under measurement flows, the magnetic sensor for sensing magnetic flux generated by the current under measurement, and the fence-shaped magnetic material through which the conductor penetrates for surrounding a part of the conductor and the magnetic sensor. The magnetic material, which has substantially uniform magnetic characteristics throughout, includes a convex at the inner surface of the magnetic material in such a position that the convex is opposed to the magnetic sensor. Thus, the current sensor of the invention does not require components such as a coil and printed-circuit board which are needed for a conventional current sensor, and a current sensor assembly is considerably facilitated.

Accordingly, the current sensor of the invention which is attachable to surface mounting is made small-sized, inexpensive and mass-producible with enhanced productivity and assembling facility so as to be suitably applicable to a wide variety of situations. Moreover, noise resistance to external magnetic field is considerably enhanced due to the surface configuration of the magnetic material which is symmetrical with respect to the two reference planes crossing at right angle.

What is claimed is:

1. A current sensor for sensing a current under measurement based upon a magnetic flux generated by said current under measurement, comprising:
   a U-shaped conductor through which said current under measurement flows;
   a magnetic sensor disposed between two straight portions parallel to each other both of which form said U-shaped conductor;
   a fence-shaped magnetic material for surrounding said two straight portions and said magnetic sensor, and is provided with a first convex opposed to said magnetic sensor; and
   a supporting member for supporting said conductor, said magnetic sensor and said magnetic material so as to position ends of said conductor and terminals of said magnetic sensor at the same side with respect to said magnetic material.

2. A current sensor of claim 1, wherein said supporting member comprises a terminal hole through which said terminals of said magnetic sensor penetrate, conductor inserting portions through which said conductor is inserted, first fixing members for fixing said magnetic sensor, second fixing members for fixing said conductor and third fixing members for fixing said magnetic material.

3. A current sensor of claim 2, wherein each of said conductor inserting portions is formed from a cylindrical member and said magnetic material is supported in such a manner as to surround said conductor inserting portions.

4. A current sensor of claim 2, wherein said supporting member are integrally molded from an elastically deformable material and said first to third fixing members are hook-shaped.

5. A current sensor of claim 1, further comprising a second convex at an inner surface of said magnetic material oppositely to said first convex, wherein said magnetic sensor is disposed within a gap between said first convex and said second convex.

6. A current sensor of claim 1 or 5, wherein said magnetic sensor is disposed such that a face of said first convex opposed to said magnetic sensor is substantially parallel to a magnetometric sensing surface of said magnetic sensor, wherein an area of said magnetometric sensing surface is smaller than that of said opposed face.

7. A current sensor of claim 1, wherein said magnetic sensor harnesses the Hall effect.

8. A current sensor of claim 1, further comprising conversion means for converting an output detected by said magnetic sensor to a corresponding value of said current under measurement.

9. A current sensor of claim 1, wherein said magnetic material is provided with a curved or tapered inner surface.

10. A current sensor of claim 9, wherein said curved or tapered surface is formed around a periphery of said first convex and said magnetic material has no acute inner surface.

11. A current sensor of claim 1, wherein a ratio of a width to a height of said magnetic material is equal to or greater than 2.5, wherein said width of said magnetic material is directed parallel to a plane defined by said two straight portions and perpendicular to said straight portions, and wherein said height of said magnetic material is directed perpendicular to said plane or said straight portions.

12. A current sensor of claim 1, wherein said supporting member is provided with at least a convex at a side where said terminals of said magnetic sensor and said two straight portions are supported.

13. A current sensor of claim 1, wherein said supporting member is provided with at least a convex or a concave around a periphery of a portion at an outer surface of said supporting member, at which portion said conductor penetrates through said supporting member.

14. A current sensor of claim 1, wherein said terminals of said magnetic sensor are folded into a predetermined shape or predetermined shapes.

15. A current sensor of claim 1 or 5, wherein a surface of said magnetic material is symmetrically shaped with respect to a reference plane which is substantially perpendicular to an opposed face of said first convex to said magnetic sensor and substantially parallel to said straight portions.

* * * * *